(12) United States Patent
Madathil et al.

(10) Patent No.: US 7,893,457 B2
(45) Date of Patent: Feb. 22, 2011

(54) BIPOLAR MOSFET DEVICES AND METHODS FOR THEIR USE

(75) Inventors: Sankara Narayanan Ekkanath Madathil, Leicester (GB); Mark Robert Sweet, Oakham (GB); Konstantin Vladislavovich Vershinin, Leicester (GB)

(73) Assignee: ECO Semiconductors Ltd., Leicester (GB)

( * ) Notice: Subject to any disclaimer, the term of this patent is extended or adjusted under 35 U.S.C. 154(b) by 478 days.

(21) Appl. No.: 11/659,812

(22) PCT Filed: Aug. 10, 2005

(86) PCT No.: PCT/GB2005/003146

§ 371 (c)(1),
(2), (4) Date: Jul. 23, 2007

(87) PCT Pub. No.: WO2006/016160

PCT Pub. Date: Feb. 16, 2006

(65) Prior Publication Data

US 2008/0191238 A1    Aug. 14, 2008

(30) Foreign Application Priority Data

Aug. 10, 2004   (GB) .................................. 0417749.9

(51) Int. Cl.
*H01L 29/745*    (2006.01)

(52) U.S. Cl. ..................... 257/133; 257/341; 257/120; 257/132; 257/134; 257/E29.201; 257/E29.216; 257/E29.221

(58) Field of Classification Search .................. 257/110, 257/139, 339–342, E29.054, E29.063, E26.066, 257/E29.175, E29.214, E29.216, E29.217, 257/E29.221, E29.222, 120, 132, 133, 134, 257/341, 370, E29.201, E29.213
See application file for complete search history.

(56) References Cited

U.S. PATENT DOCUMENTS

| | | | |
|---|---|---|---|
| 5,483,087 A * | 1/1996 | Ajit ............................ | 257/120 |
| 6,417,542 B2 | 7/2002 | Werner | |
| 6,624,494 B2 * | 9/2003 | Blanchard et al. ............ | 257/493 |
| 6,639,278 B2 * | 10/2003 | Sumida et al. .............. | 257/342 |
| 6,646,304 B1 | 11/2003 | Tihanyi et al. | |
| 6,724,043 B1 * | 4/2004 | Ekkanath Madathil ...... | 257/341 |
| 7,279,747 B2 * | 10/2007 | Ninomiya .................... | 257/341 |
| 2003/0213993 A1 * | 11/2003 | Spring et al. ................ | 257/330 |

* cited by examiner

*Primary Examiner*—Jerome Jackson, Jr.
*Assistant Examiner*—Yu Chen
(74) *Attorney, Agent, or Firm*—Volentine & Whitt, PLLC

(57) ABSTRACT

A semiconductor device includes at least one cell including a base region of a first conductivity type having disposed therein at least one emitter region of a second conductivity type, a first well region of a second conductivity type, a second well region of a first conductivity type, a drift region of a second conductivity type, a collector region of a first conductivity type, and a collector contact. Each cell is disposed within the first well region, and the first well region is disposed within the second well region. The device further includes a first gate in communication with a base region so that a MOSFET channel can be formed between an emitter region and the first well region, and at least one embedded region embedded in the first well region. The device is configured such that during operation of the device a depletion region at a junction between the base region and the first well region can extend to a junction between the first well region and the second well region.

19 Claims, 14 Drawing Sheets

BIPOLAR MOSFET DEVICES AND METHODS FOR THEIR USE

This invention is generally concerned with the family of power semiconductor devices of the kind which combine bipolar and MOS technology, hereinafter termed bipolar MOSFET devices.

There is a wide range of known bipolar MOSFET devices. Of particular relevance to the present application are the devices disclosed in International Publication number WO 01/18876, the contents of which are herein incorporated by reference. WO 01/18876 provides, in its introduction, a description of a number of known prior art bipolar MOSFET devices. The invention described in WO 01/18876 primarily concerns a family of devices which achieve a so-called "self-clamping" condition in which a first well region of the device is protected from excess potential during operation of the device due to the extension of a depletion region at the junction between a base region and a first well region to the junction between the first well region and a second well region. The self-clamping condition is a desirable feature which leads to numerous advantages, both in the on-state and off-state of the device. Advantageous characteristics of such devices include: low forward drop; good safe operating area (SOA); high break down voltage; switching capabilities which are comparable to those of an insulted gate bipolar transistor (IGBT); MOS gate control; the provision of three terminal devices; full compatibility to a CMOS process, enabling monolithic integration of low voltage and high voltage devices; easy scaling of gate oxide thicknesses to lower values to achieve low drive power requirements; and reduced gate capacitance as a result of reduced gate dimensions over the drift region. Devices disclosed in WO 01/18876 include IGBT type devices, emitter switch thyristor (EST) type devices and insulated base EST type devices.

Whilst the devices of WO 01/18876 exhibit excellent characteristics, it has been found that, in practice, the design of the device on the emitter side of the device can be further simplified under manufacture to provide wider tolerance. The present invention seeks to provide this simplification and wider tolerance. Furthermore, the present invention removes or at least reduces the restrictions in the design of the emitter side of the device whilst preserving the desirable self-clamp feature, enabling the potential of the emitter side of the device to stay at a low value whilst the increase in anode potential is supported by the drift region. The self-clamping feature is used to achieve current saturation during the on-state, switching and to protect the emitter side of the device from destruction due to high electric fields over a wide range of operation conditions. Other advantages associated with the invention are enhanced reliability, high area efficiency, and improved ability to control the concentration of the second well region.

According to a first aspect of the invention there is provided a semiconductor device including:

at least one cell including a base region of a first conductivity type having disposed therein at least one emitter region of a second conductivity type;

a first well region of a second conductivity type;

a second well region of a first conductivity type;

a drift region of a second conductivity type;

a collector region of a first conductivity type;

a collector contact;

in which each cell is disposed within the first well region and the first well region is disposed within the second well region; the device further including:

a first gate in communication with a base region so that a MOSFET channel can be formed between an emitter region and the first well region;

and at least one embedded region embedded in the first well region;

in which the device is configured such that during operation of the device a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region, the extension of the depletion junction being achieved through punch-through of at least one transistor having the embedded region as a component thereof.

Generally, an emitter region of a cell is in communication with an emitter contact. In a device comprising more than one cell, it is possible to connect the emitter contacts together to form an emitter structure. However, it is not necessary that all cells have an emitter contact nor that all emitter contacts are connected to form an emitter structure. In particular, it is possible to provide devices in which some emitter regions are not connected to an emitter structure. This may be achieved by not connecting an emitter contact to an emitter structure, so that the emitter contact electrically "floats". Alternatively, one or more cells may be provided in which the emitter regions do not have associated emitter contacts. In these embodiments, the emitter regions which are not connected to an emitter structure can be regarded as "dummy emitters". The provision of dummy emitters appears to enhance on-state behaviour and improve the saturation properties of devices of the invention.

The first conductivity type is typically P, and the second type N. However, it is possible to produce devices in which the first conductivity type is N, and the second P. Devices according to the invention can be vertical or lateral. Gates can be planar, a trench gate, or may extend parallel to an axis of the device.

The semiconductor device may further include a second gate in communication with the second well region so that a MOSFET channel can be formed between the first well region and the drift region.

Alternatively, the semiconductor device may further include:

a region of a first conductivity type in contact with an emitter contact; and a region of a second conductivity type disposed between the region of a first conductivity type and the second well;

in which the region of a second conductivity type connects the first well region to the drift region in a JFET structure formed by the second well, said region of a second conductivity type and said region of a first conductivity type.

In this configuration, the emitter contact which is in contact with the region of a first conductivity type is typically grounded. During the operation of the JFET, the potential of the region of a second conductivity type increases with the drift region potential and collector region potential, whilst the potential of the region of a first conductivity type is grounded through the emitter contact. Thus, the current passing through the JFET region is pinched-off, ensuring current saturation and protecting the emitter region from high potentials.

Preferably, the embedded region is formed from material of the first conductivity type. However, the embedded region can be air, an insulating material, another semiconductor material or a combination of the above mentioned materials and substances.

The embedded region may be in contact with an emitter contact. Typically, this emitter contact is grounded. In the forward operation mode of the device, the potential of the first well region rises with the collector potential, due to the high modulation of the drift region achieved as a result of thyristor action. However, the potential of the embedded region is grounded through the emitter contact. Thus, the base of the transistor formed by the second well region, the first well region, and the grounded embedded region punches through. Any further increase in the collector potential is then shared by the drift region and the second well region, whilst the first well region potential is kept at a fixed value. The embedded region may be in contact with the first gate. The embedded region may be disposed substantially underneath the first gate.

Alternatively, the embedded region may be electrically floating. Alternatively still, the embedded region is held at an ungrounded potential through connection with an electrical contact.

The embedded region may be encapsulated within the first well region. In such embodiments, it is preferred that the embedded region is electrically floating, although it is possible to provide contact with an emitter contact. When the embedded region is electrically floating, self-clamping can be achieved by punch-through of the base of a transistor formed by the base region, the first well region and the embedded region, and/or by punch-through of the base of a transistor formed by the embedded region, the first well region and the second well region.

The embedded region may extend substantially from one side of the base region to the other.

The semiconductor device may comprise a substantially coplanar arrangement of a plurality of embedded regions disposed at a substantially common depth beneath the base region.

The semiconductor device may comprise a stacking of embedded regions. The device may comprise a stacking of embedded regions which extend substantially from one side of the base region to the other. Alternatively, the device may comprise a stacking of a plurality of substantially coplanar arrangements of a plurality of embedded regions disposed at a substantially common depth beneath the base region.

The doping concentration in the portion of the first well region which extends between the base region and the embedded region may be different to the doping concentration in the portion of the first well region which extends between the embedded region and the second well region. Advantageous forward drop and safe operating area characteristics are associated with this approach. Further advantages include improved processing and switching ability. The doping concentration in the portion of the first well region which extends between the base region and the embedded region may be higher than the doping concentration in the portion of the first well region which extends between the embedded region and the second well region. Alternatively, the doping concentration in the portion of the first well region which extends between the base region and the embedded region may be lower than the doping concentration in the portion of the first well region which extends between the embedded region and the second well region.

In preferred embodiments, the device includes a plurality of base regions disposed within the first well region, each base region having at least one emitter region disposed therein. It is an advantage of the invention that such clusters of "cells" can be provided, and that the "cells" can be clustered in a very tightly packed arrangement, leading to homogeneous current density. It is possible, and desirable, that the cell or cells are each substantially symmetric about an axis extending through the first well region.

According to a second aspect of the invention there is provided a method of operating a semiconductor device, the device including:

at least one cell comprising a base region of a first conductivity type having disposed therein at least one emitter region of a second conductivity type;

a first well region of a second conductivity type;

a second well region of a first conductivity type;

a drift region of a second conductivity type;

a collector region of a first conductivity type;

a collector contact;

in which each cell is disposed within the first well region and the first well region is disposed within the second well region, the device further comprising:

a first gate in communication with a base region so that a MOSFET channel can be formed between an emitter region and the first well region;

and at least one embedded region embedded in the first well region;

the method comprising the step of applying potentials to the device so that a depletion region at a junction between the base region and the first well region can extend to a junction between the first well region and the second well region, thereby substantially isolating the potential of the first well region from any increase in the potential of the collector contact so that the device can be turned off without having to form a MOSFET channel between the base region and the second well region, the extension of the depletion junction being achieved through punch-through of at least one transistor having the embedded region as a component thereof.

The device may be any device according to the first aspect of the invention.

In embodiments in which the embedded region is in contact with an emitter contact, the step of applying potentials to the device may include causing the base of a transistor formed by the second well region, the first well region and the embedded region to punch-through.

In embodiments in which the embedded region is electrically floating, the step of applying potentials to the device may include i) causing the base of a transistor formed by the base region, the first well region and the embedded region to punch-through and/or ii) causing the base of a transistor formed by the embedded region, the first well region and the second well region to punch-through.

A third aspect of the present invention now provides a JFET-switched power semiconductor device including:

a collector contact;

a collector region of a first conductivity type;

a drift region of a second conductivity type;

at least one well region of first conductivity type;

at least one well region of second conductivity type;

an emitter contact to the at least one wall region of second conductivity type; and a gate electrode overlying at least the well region of first conductivity type.

A fourth aspect of the present invention provides a semiconductor device including, integrated on a single substrate, a power switching device structure and a JFET structure arranged to switch said power switching device structure on or off.

Examples of devices and methods in accordance with the invention will now be described with reference t the accompanying drawings, in which.

Figure 1:
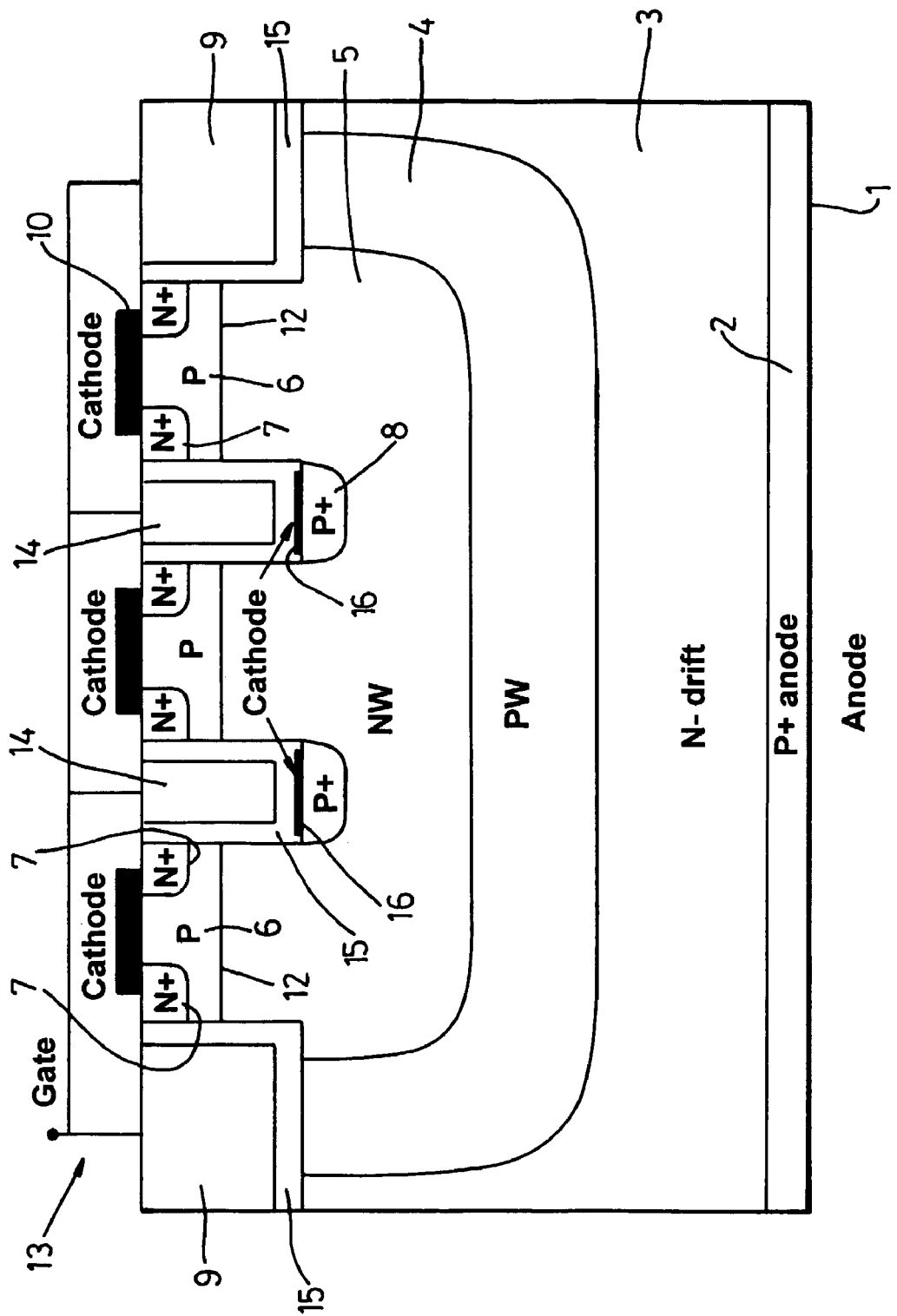
FIG. 1 is a cross-sectional view of a first embodiment of a device of the invention.

FIG. 1 shows a first embodiment of a semiconductor device comprising a collector contact 1 (the anode in this example), a P+ collection region 2 to which the collector contact 1 is made, and a N− drift region 3. Located in the N− drift region 3 is a second well region 4 of P type material. A first well region 5 of N type material is disposed within the second well region 4. The device further comprises a plurality of cells 12 which are disposed within the first well region 5. The cells 12 comprise a P type base region 6 having disposed therein N+ emitter regions 7. The emitter regions 7 of each cell 12 are connected to an emitter contact 10 (the cathode in this example). Also provided is a gate structure shown generally at 13. The gate structure 13 comprises first gates 14 which are disposed with respect to the base regions 6 so that a MOSFET channel can be formed between emitter regions 7 and the first well region 5. In the embodiment shown in FIG. 1, the first gates 14 are trench gates extending into the device along a wall of a base region 6. It is also possible to produce devices according to the invention using different gate configurations, such as a planar gate, or a gate running in the third dimension, i.e., out of the plane of the paper in FIG. 1. The gate structure 13 further comprises second gates 9 disposed over the second well region 4 so that a MOSFET channel can be formed between the first well region 5 and the drift region 3. The second gates 9 shown in FIG. 1 are of the trench gate type; however, other gate configurations might be utilised, such as a planar gate, or a gate running in the third dimension, i.e., out of the plane of the paper in FIG. 1. The gate structure 13 further comprises oxide layers 15. As shown in FIG. 1, the first and second gates are connected together to provide a single terminal. It is also possible to operate one or more of the gates separately. For example, it is possible to control the first gates separately from the second gates. The device further comprises P+ embedded regions 8 which are each in contact with an emitter contact 16 (cathode contacts in this example). Advantageously, the emitter contacts 16 run in the third dimension, i.e., normal to the plane of the paper of FIG. 1. The oxide thicknesses of the first and second gates can be dissimilar.

The device shown in FIG. 1 shares many of the structural features and operational characteristics of devices disclosed in International Publication WO 01/18876. The principal difference is the provision of the P+ embedded regions 8 in contact with the emitter contacts 16. These features enable the device of FIG. 1 to provide the self-clamping feature discussed generally in WO 01/18876. In the forward operation mode, the potential of the first well region 5 raises with the collector potential, due to the high modulation of the drift region 3 achieved as a result of thyristor action. However, the potential of the embedded region 8 is grounded through the emitter 16. Thus, the base of the transistor formed by the second well region 4, the first well region 5 and the grounded, embedded region 8 punches-through. Any further increase in the collector potential is shared only by the drift region 3 and the second well region 4, whilst the first well region potential is kept at a fixed value. This feature protects the emitter side of the device from high electric fields and high potentials, ensures current saturation, good safe operating area and switching.

Figure 8A:
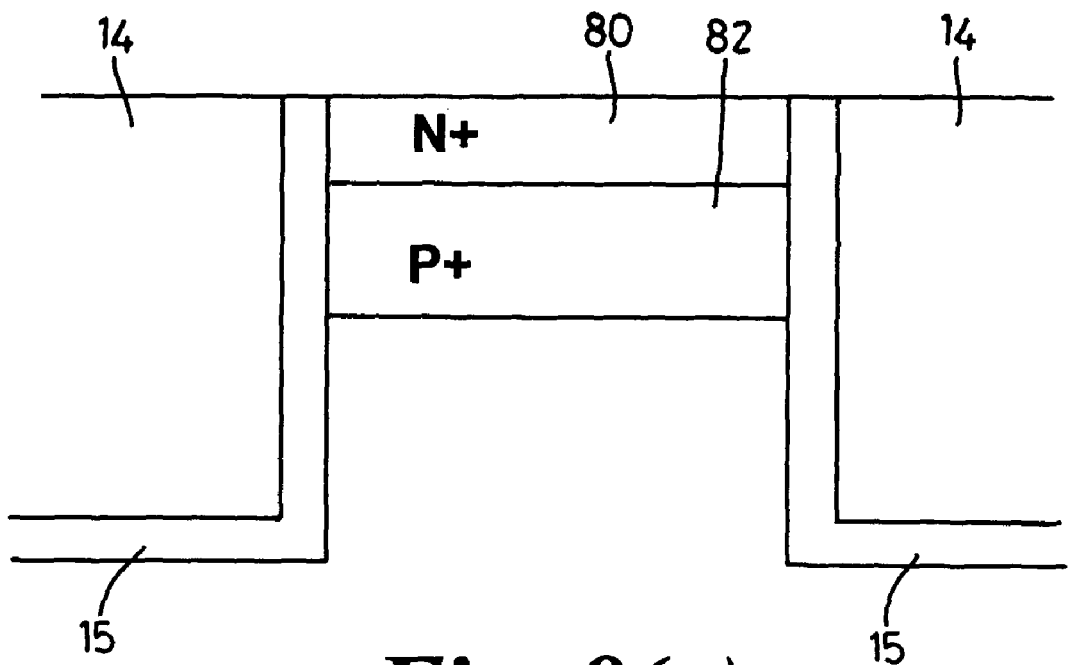
FIG. 8 shows (a) a first embodiment and (b) a second embodiment of a dummy cathode.
Figure 8B:
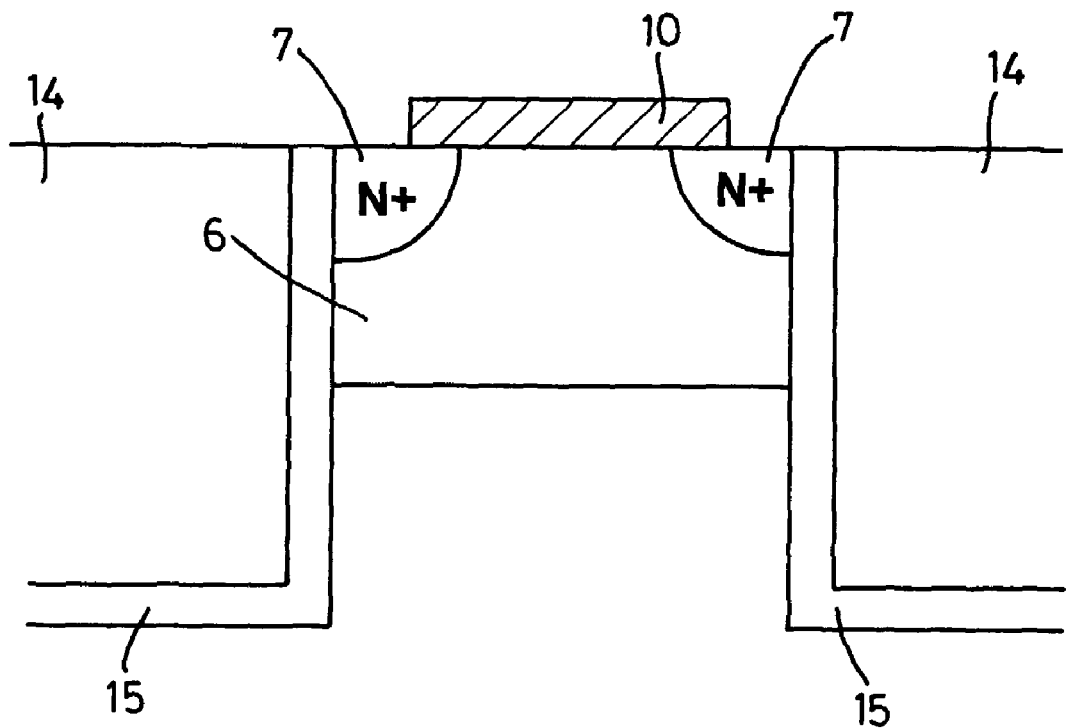

The cathodes 10 can be electrically connected to form a cathode structure. However, it is also possible to provide cells in which the N+ emitter regions are not connected to a cathode structure. Cells which are not connected in this way can be described as having "dummy" cathodes. FIGS. 8(a) and (b) depict two examples of cells which are not connected to a cathode structure. Note that the structures shown in FIGS. 8(a) and (b) share a number of features with the device shown in FIG. 1: identical numerals are used to denote such shared features. In FIG. 8(a) a cell comprises a N+ emitter region 80 disposed over a P type base region 82. In this embodiment, there is no cathode contact in connection with the cell. FIG. 8(b) shows an embodiment of a cell in which a cathode contact is disposed over the emitter regions 7 of the cell. However, in this embodiment the cathode contact 10 is not connected to a cathode structure, and thus the cell electrically "floats". It has been found that the provision of dummy cathodes can enhance on-state behaviour and improve the saturation properties of the device.

Figure 2:
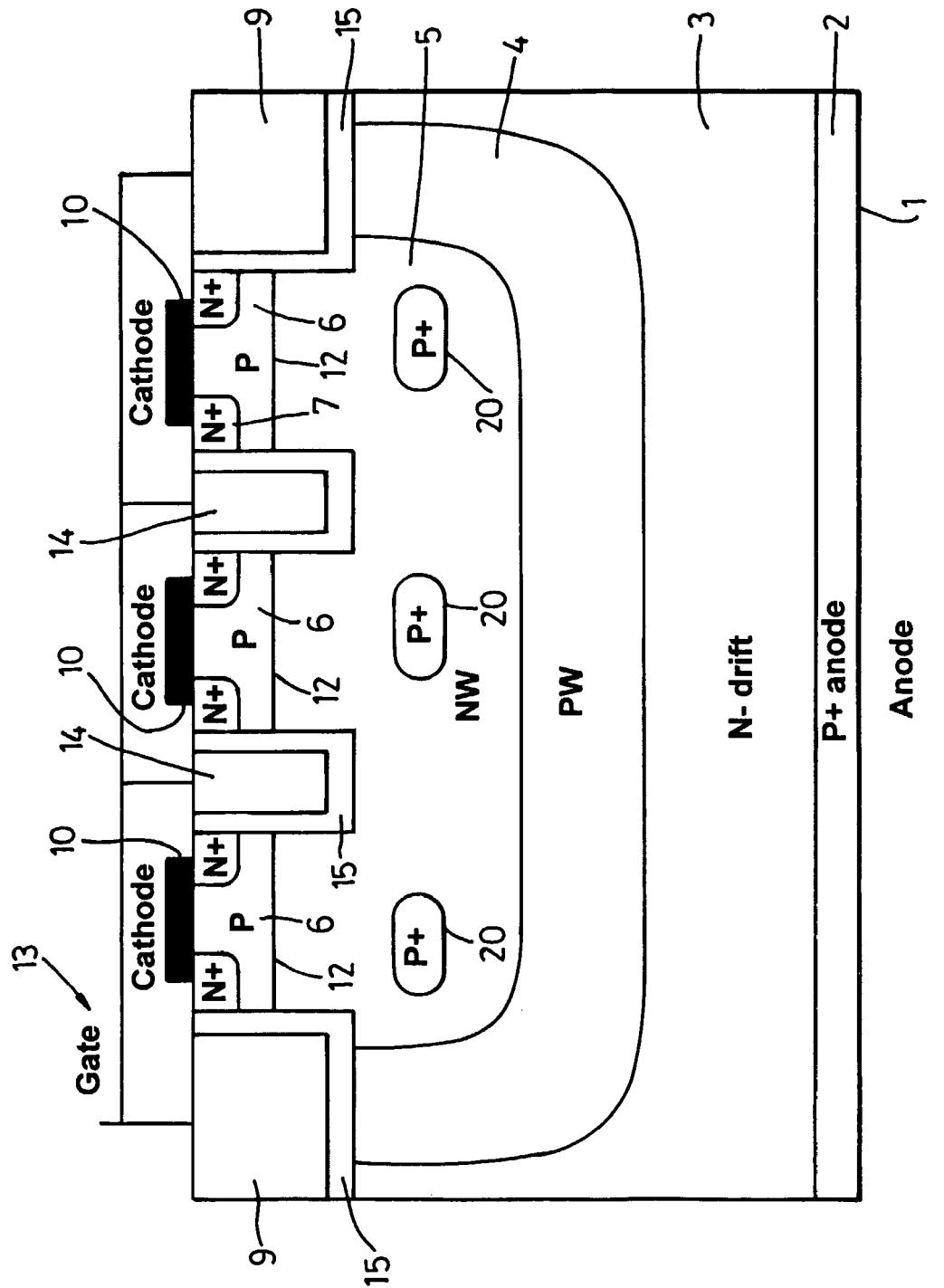
FIG. 2 is a cross-sectional view of a second embodiment of a device of the invention.

FIG. 2 shows a second embodiment of a device of the invention. The device shares a number of features with the first embodiment of a device shown in FIG. 1: identical numerals are used to denote such shared features. In addition to the shared features, the device further comprises a plurality of P+ embedded regions 20 placed within the first well region 5. All of the embedded regions 20 are electrically floating. The embedded regions 20 are disposed in a substantially coplanar arrangement at a substantially common depth beneath the base regions 6. As explained in more detail below, other arrangements of one or more embedded regions are also possible. As noted, the layer of embedded regions 20 placed within the first well region 5 are floating. In the forward operation mode, the self-clamping feature is achieved in two steps:

1. Firstly, by the punch-through of the base of the transistor formed by the base region 6, the first well region 5 and the floating embedded regions 20 placed within the first well region 5.

2. Secondly, by the punch-through of the base of the transistor formed by the floating embedded regions 20, the first well region 5 and the second well region 4.

Figure 3:
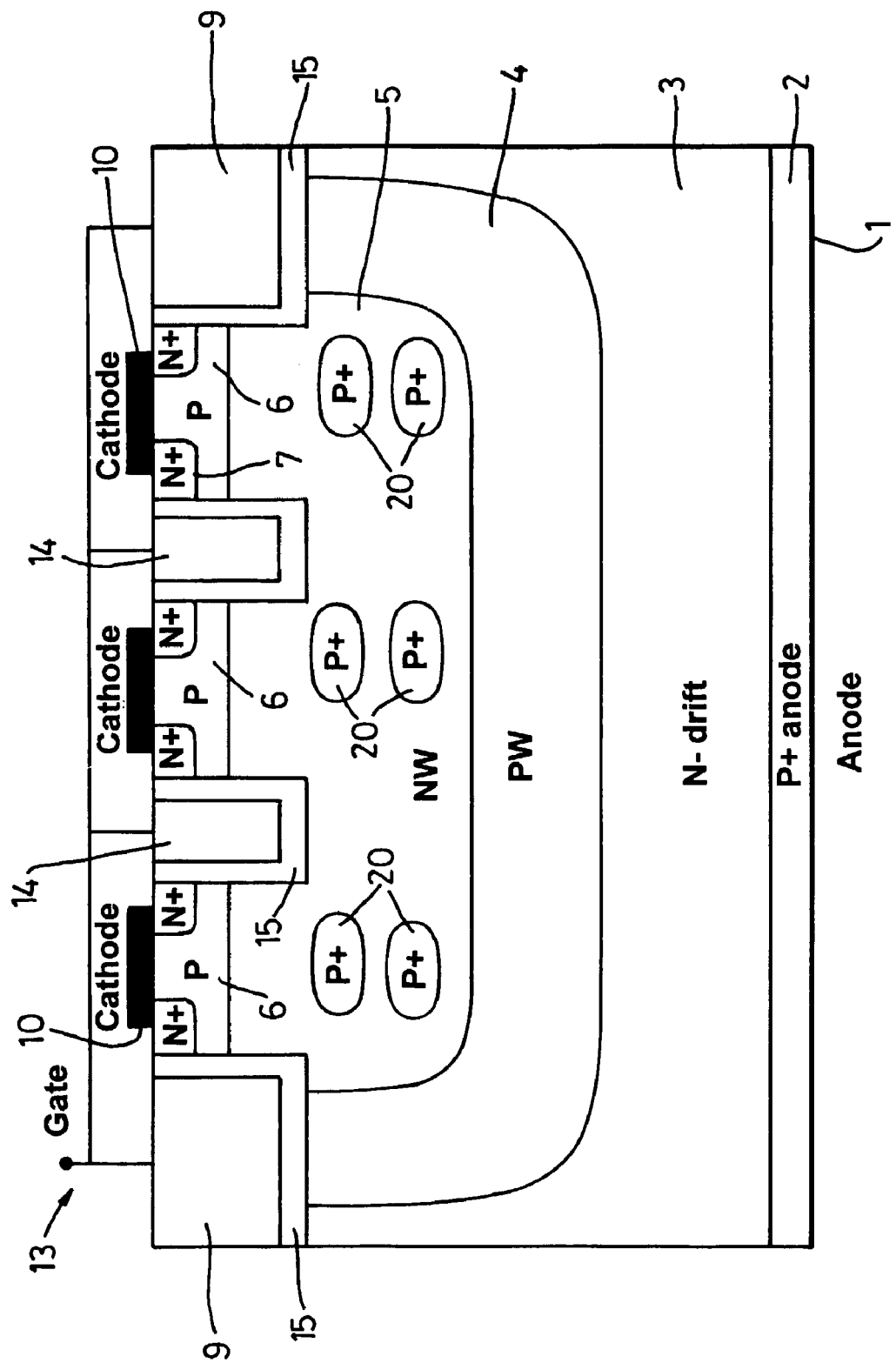
FIG. 3 is a cross-sectional view of a third embodiment of a device of the invention.
Figure 4:
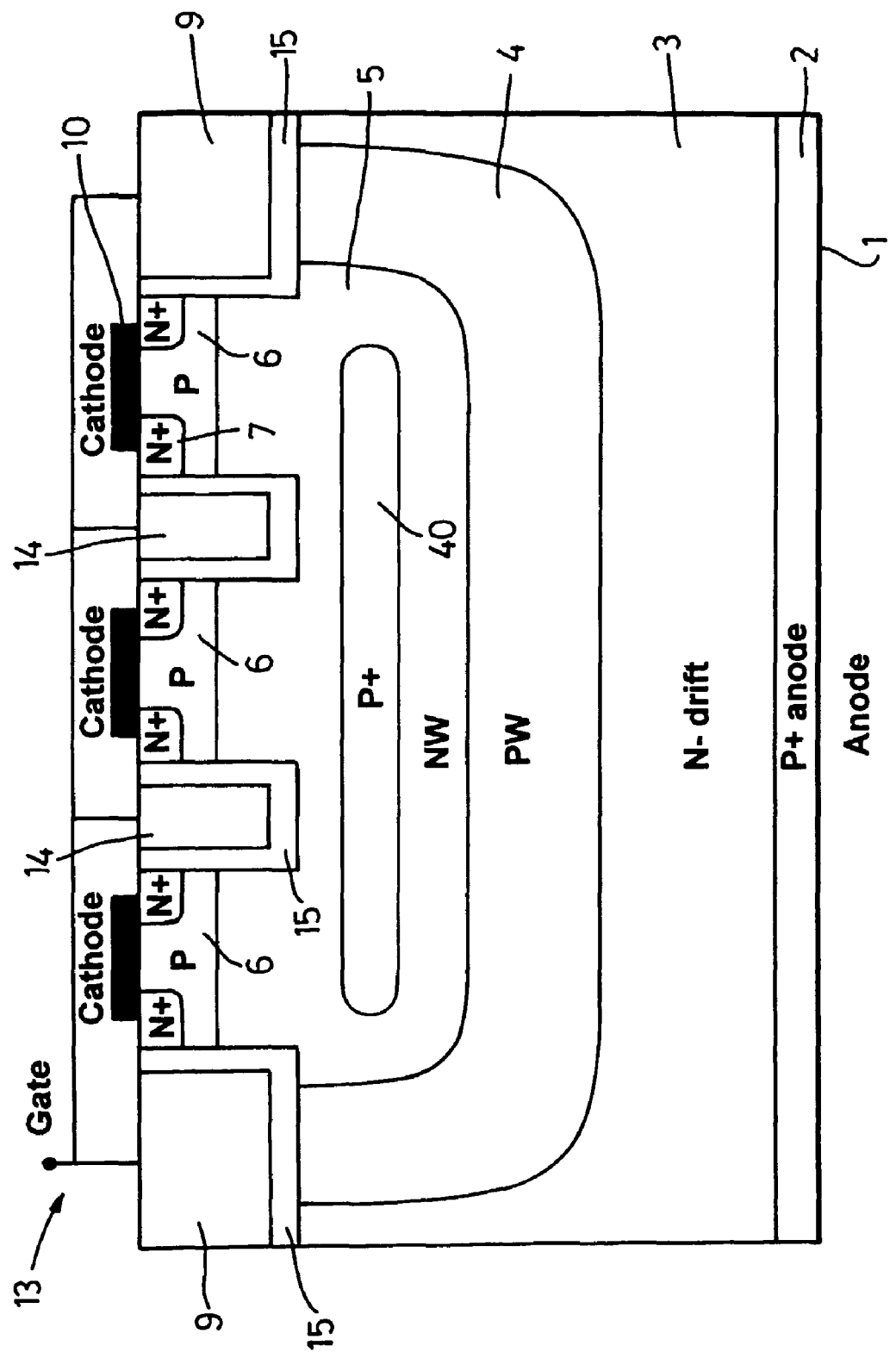
FIG. 4 is a cross-sectional view of a fourth embodiment of a device of the invention.
Figure 5:
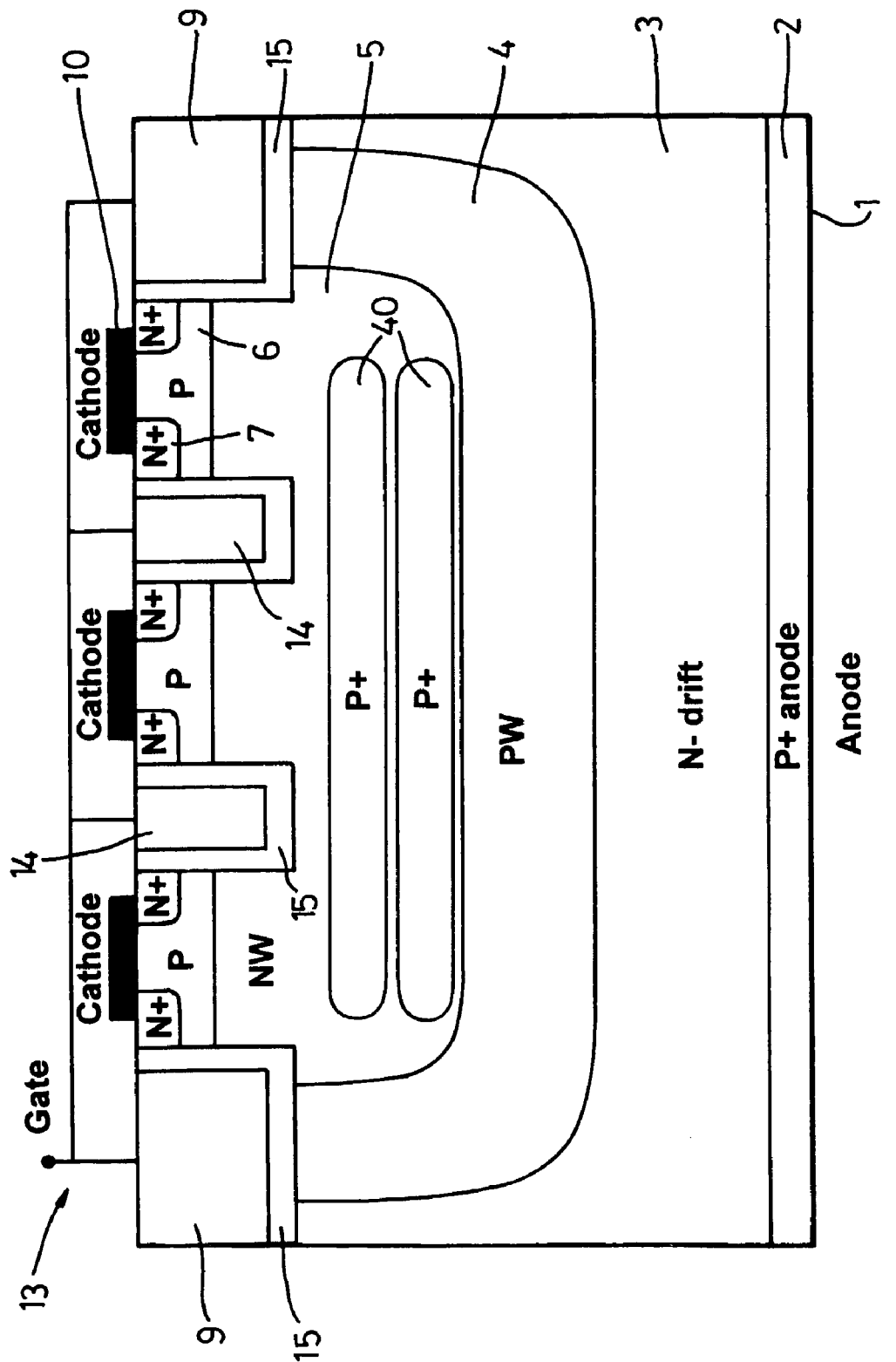
FIG. 5 is a cross-sectional view of a fifth embodiment of a device of the invention.
Figure 6A:
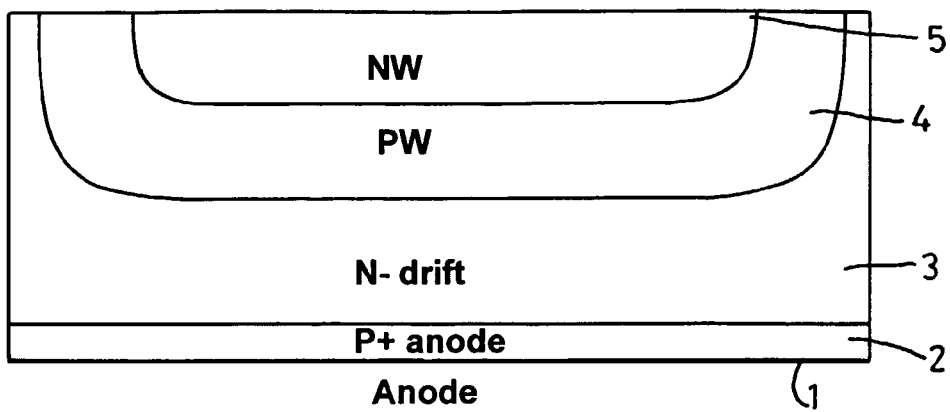
FIG. 6 shows steps in the fabrication of a device of the third embodiment.
Figure 6B:
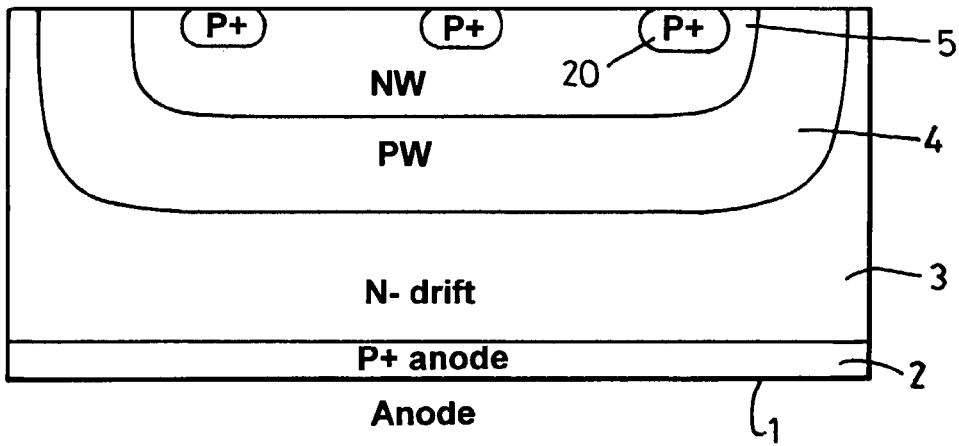
Figure 6C:
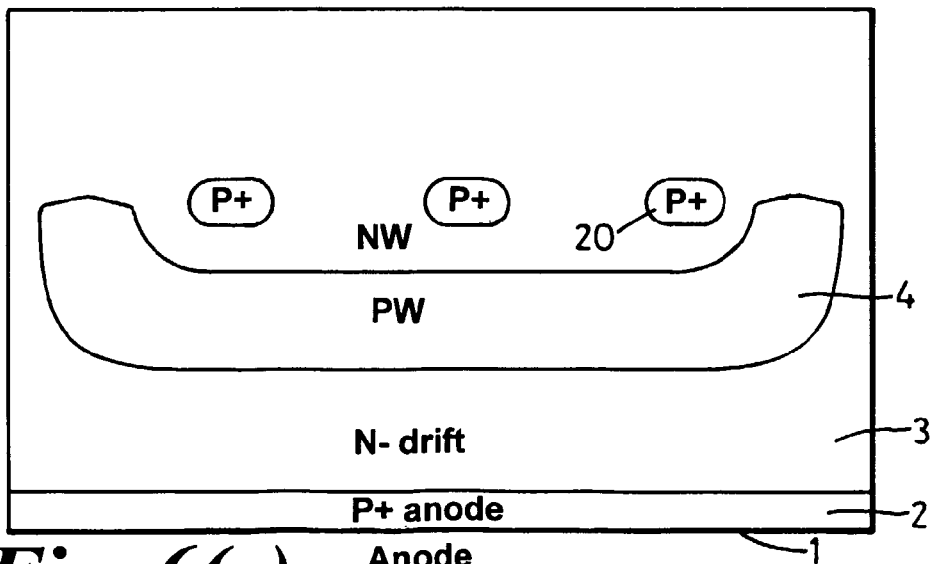
Figure 6D:
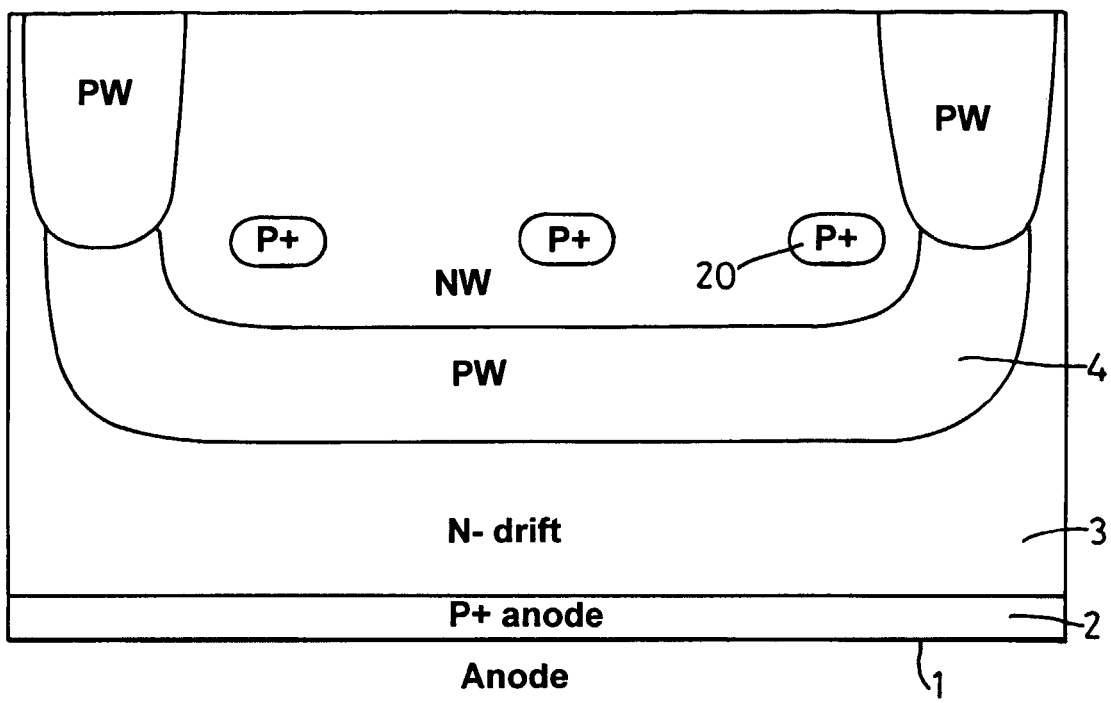
Figure 6E:
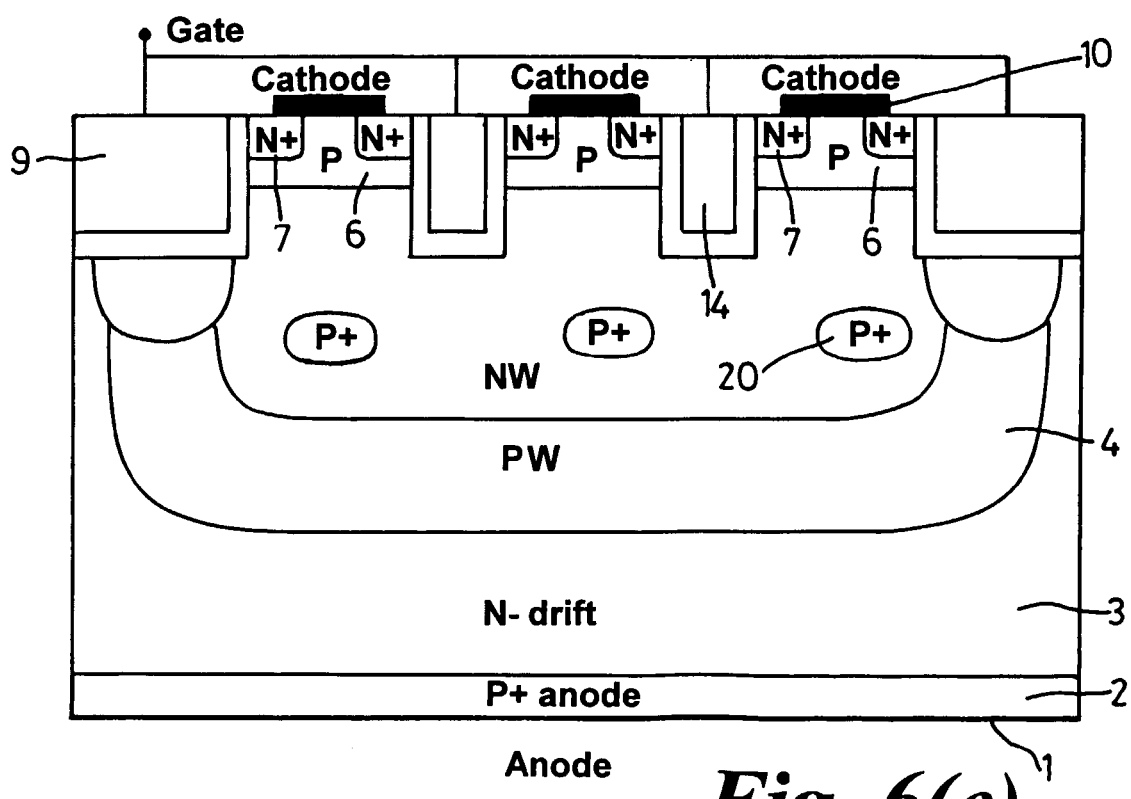

FIGS. 3 to 5 show further embodiments of devices having one or more electrically floating P+ embedded regions within the first well region 5. The devices shown in FIGS. 3 to 5 share a number of common structural features with the second embodiment shown in FIG. 2: identical numerals are used to denote such shared features. In FIG. 3, a device is shown having a stacking of layers of embedded regions 20. Each layer in the stacking is a substantially coplanar arrangement of embedded regions 20. FIG. 4 shows a device having a single embedded region 40 which extends underneath all of the base regions 6 in a cell cluster. FIG. 5 shows a device having a plurality of embedded regions 40 of the type shown in FIG. 4. The embedded regions 40 are stacked, with a layer of N type material provided by the first well region 5 being present between the embedded regions 40. In embodiments in which multiple layers of embedded regions are used, such as shown in FIGS. 3 and 5, self-clamping occurs from the embedded region closest to the emitter down to the second well region 4.

FIG. 6 shows the fabrication of the second device embodiment shown in FIG. 2. FIG. 6(a) shows implant and drive-in for the first well region 5 and the second well region 4. FIG. 6(b) shows implant and drive for the first well region 5, second well region 4 and floating embedded regions 20. FIG. 6(c) shows epitaxial growth of further N type material. FIG. 6(d) shows implant and drive-in of further P type materials for the first well region 5. FIG. 6(e) shows the rest of the process, namely; implant and drive-in of base region 6, gates 9 and 14 and emitter 7 formation. Similar fabrication techniques can be used to produce the devices shown in FIGS. 1, and 3 to 5.

Figure 7:
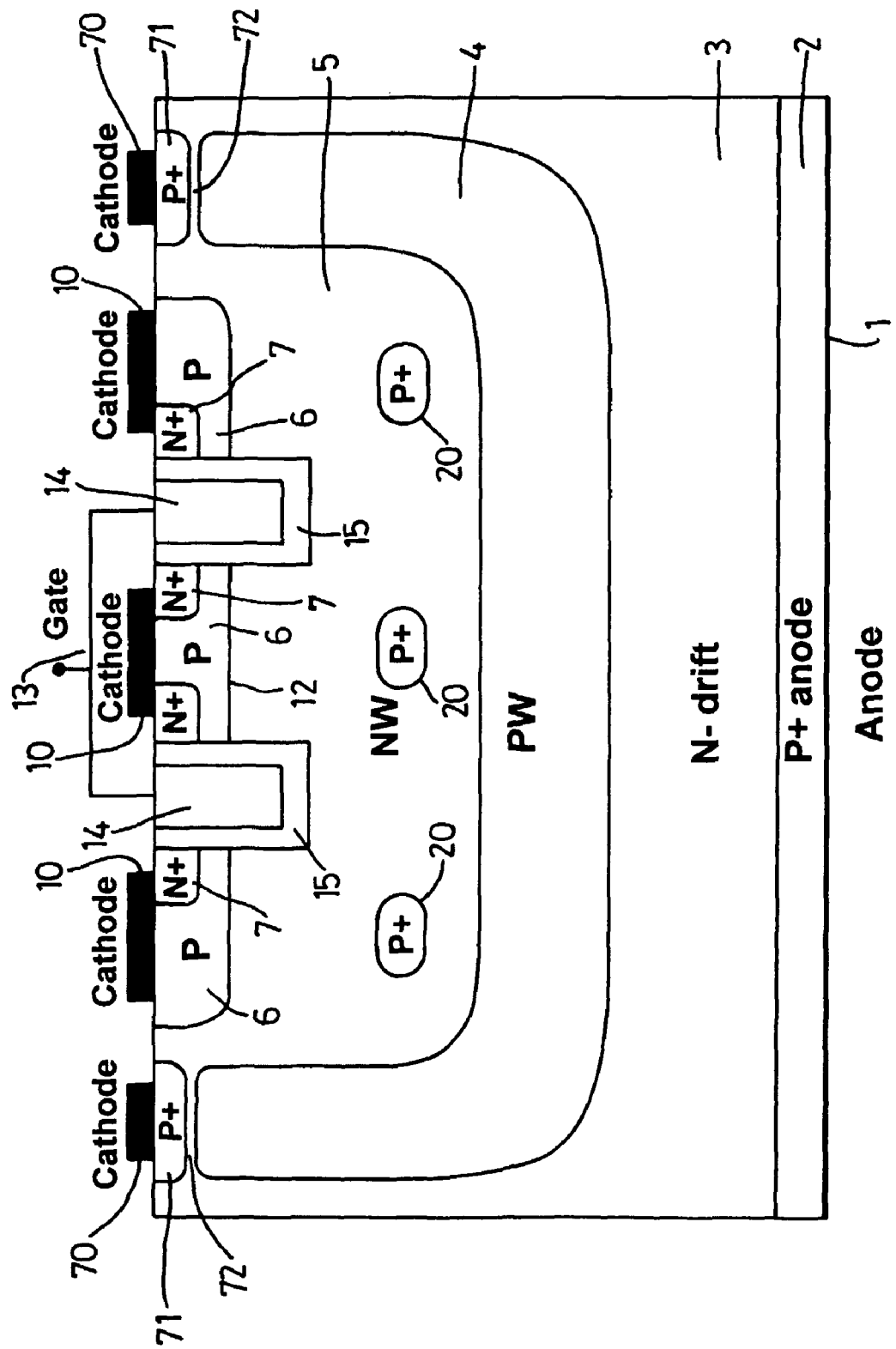
FIG. 7 shows a cross-sectional view of a sixth embodiment of a device of the invention.

FIG. 7 shows a sixth embodiment of the invention. The sixth embodiment shares a number of features with the second embodiment shown in FIG. 2: identical numerals are used to denote such shared features. The principal difference is that a JFET structure is employed in place of the MOSFET structure comprising the second gate 9 of FIG. 2. The JFET structure comprises an emitter contact 70 which is in contact with a P+ region 71, and a N type region 72 disposed between the P+ region 71 and the second well 4. The N type region 72 links the first well region 5 to the N− drift region 3 in a JFET structure. More specifically, the second well region 4, the P+ region 71 and the N type region 72 form a JFET. The potential of the N type region 72 increases with the potential of the drift region 3 and collector region 2, whilst the potential of the P+ region 71 is grounded through the emitter 70. Thus, the current passing through the JFET structure is pinched off, ensuring current saturation and protecting the emitter area from high potentials. As the P+ region 71 is connected to ground and the potential of the first well 5 and second well 4 increases, the JFET is punched through in a similar manner to punch through of the previously described base region/first well region/second well region transistor. This can result in effective clamping of the second well 4 even without punch-through of the transistor. Thus a separate self-clamping mechanism is provided, and the concentration of the first well 5 can be increased. In this way the JFET structure participates in the self-clamping mode of operation of the device, in addition to the embedded regions 20. The other forms of embedded regions described in accordance with the invention can also be implemented in accordance with embodiments of the invention in which the JFET structure described in respect of the sixth embodiment is employed. Fabrication of the structure shown in FIG. 7 can be achieved by epitaxial growth and implant of a P type implant. Fabrication steps can include implant and drive in of the first well 5 and second well 4, followed by epitaxial growth of a N type layer including the N region 72, followed by the formation of the rest of the device. Devices which use the JFET type structure shown in FIG. 7 are particularly useful in conjunction with wide band gap semiconductors, such as silicon carbide devices.

Further examples of JFET type devices will now be described.

Figure 9:
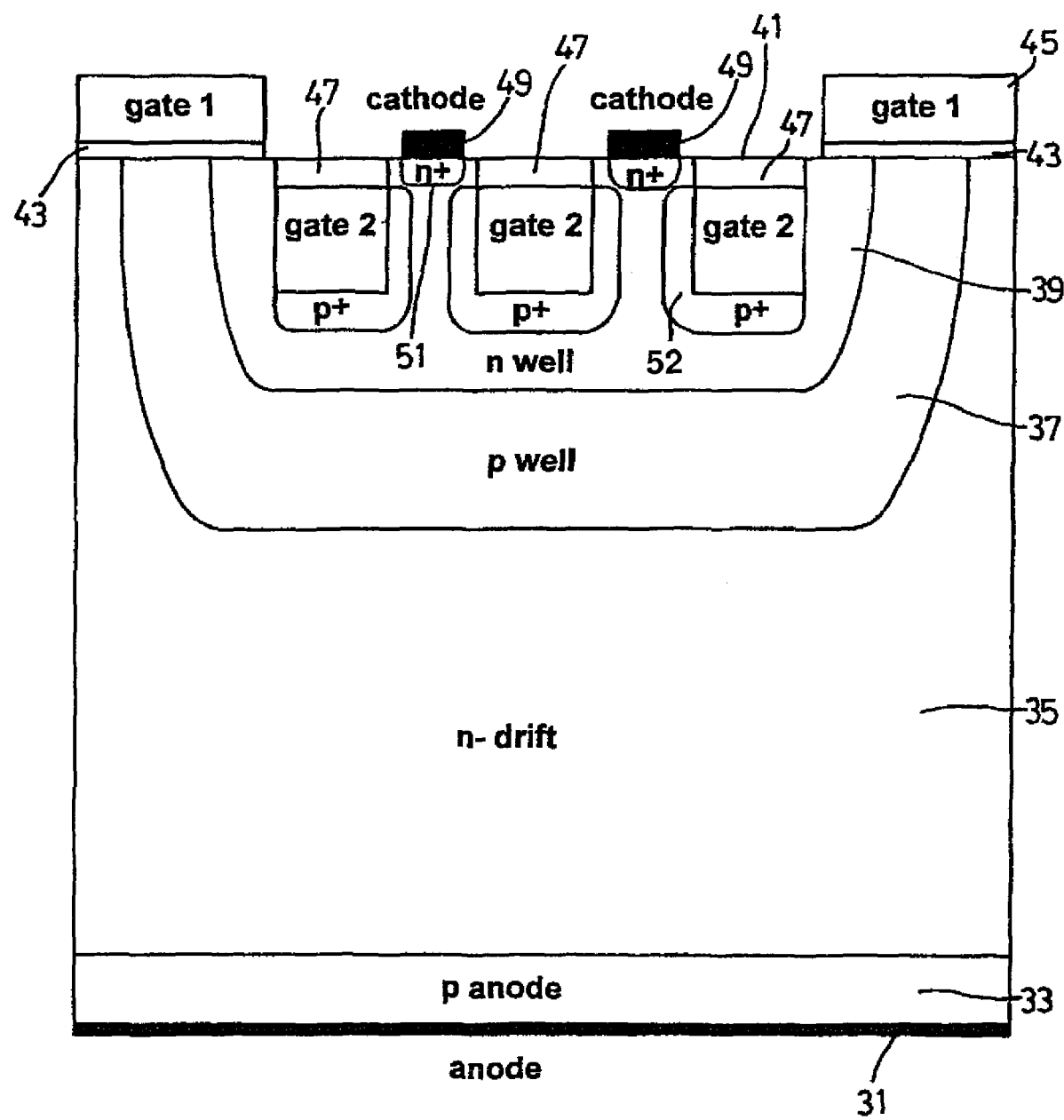
FIG. 9 shows a cross-sectional view of a seventh embodiment of a semiconductor device according to the present invention, which incorporates a MOSFET turn-on structure.

Turning now to FIG. 9, there is shown a device employing MOSFET technology to switch the CIGBT kind of structure.

A collector 31 is in contact with a P− type anode 33 which is formed in contact with an N− drift region 35, embedded in which is a P well region 37, inside which is situated a N well region 39. The P well region 37 thus separates the N well region 39 from the N− drift region 35, both in the body of the device and at the upper surface 41 thereof.

On this upper surface, is formed a metal oxide insulation layer 43 over the P well region 37, the upper surface of the N− drift region 35 and the N well region 39. Above this insulation layer 43 is formed a first gate electrode 45.

An embedded second gate electrode 47 is formed in segmented fashion, in contact with the N well region 39 but partially surrounded by an embedded P+ region 52.

Thus, the first gate electrode 45 with its insulating metal oxide layer 43 forms a MOS inversion channel between the drift region 35 and the P well region 37.

Segmented emitter electrode 49 is in contact with N+ emitter contact regions 51 interspersed between the segments of the second gate electrode 47.

Figure 10:
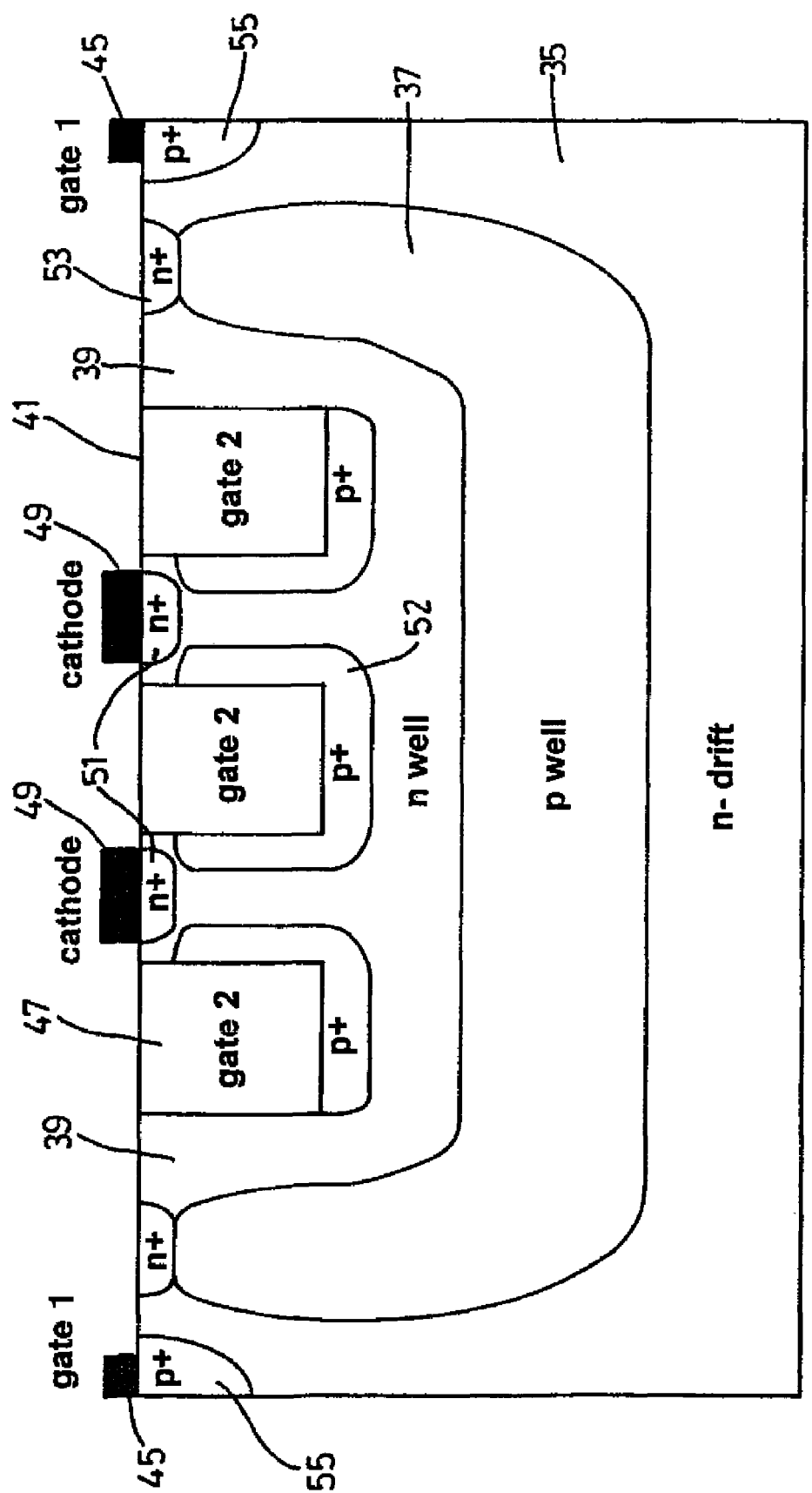
FIG. 10 shows a first variant of an eighth embodiment of a semiconductor device according to the present invention with a vertical JFET turn-on structure.
Figure 11:
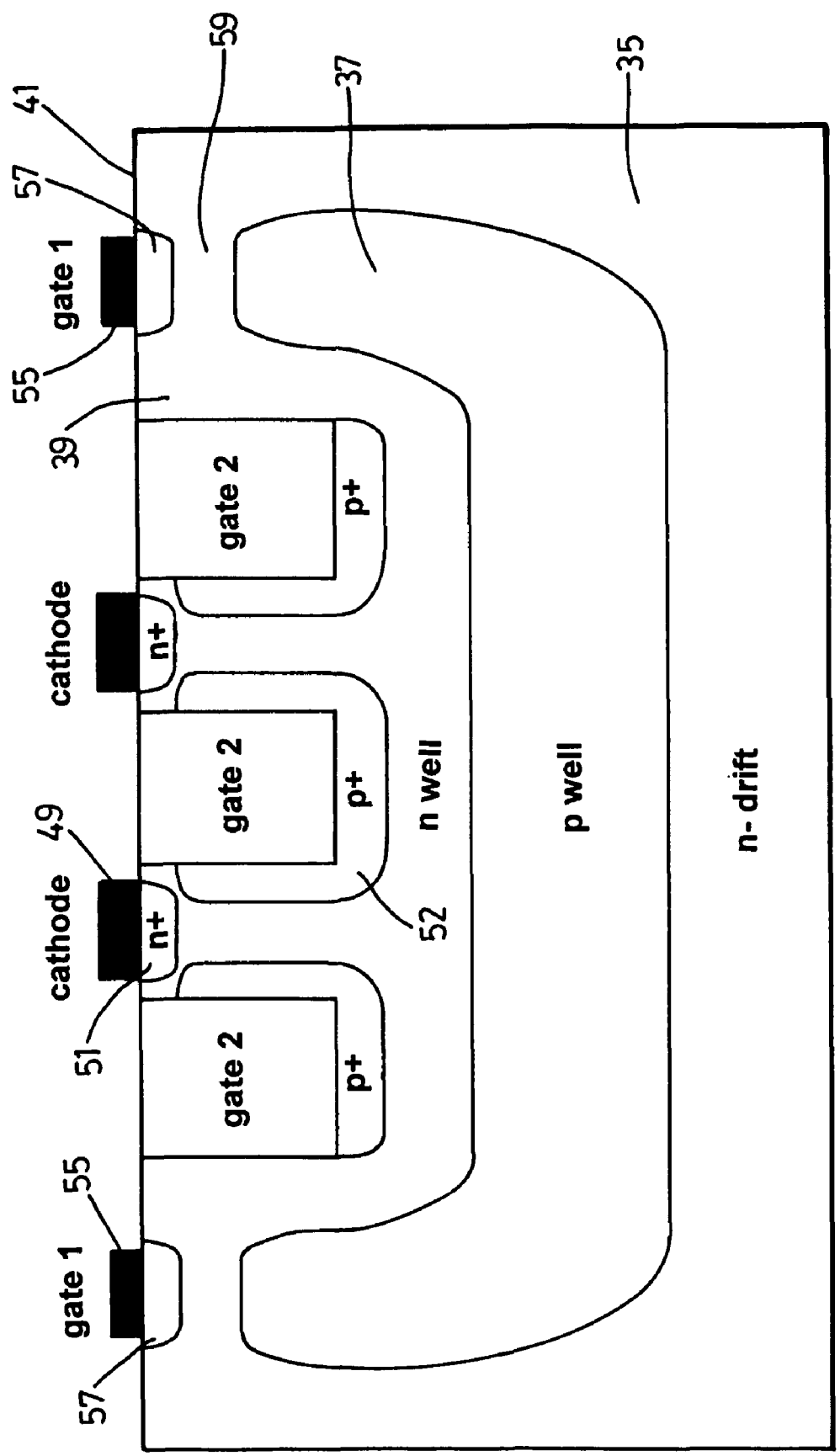
FIG. 11 shows a second variant of an eighth embodiment of a semiconductor device according to the present invention, with a lateral JFET turn-on structure.

FIGS. 10 and 11 show a structure which is analogous to the structure shown in FIG. 9, except that instead of the MOSFET turn-on structure, respectively either a vertical JFET turn-on structure or a lateral JFET turn-on structure is employed. Therefore, the same reference numerals are used for equivalent regions of the device. In both these variants of this embodiment, the P well region 37 does not reach the upper surface 41 of the device. In the variant of FIG. 10, a N+ region 53 is situated between the P well region 37 and the upper surface 41. The first gate electrode 45 is in contact with the N-drift region 35 via a P+ region 55.

In the lateral variant of FIG. 10, shown in FIG. 11, the first gate contacts the N well region 39 and the N− drift region 35 via a P+ region 57, situated between the first gate electrode 55. The transition region 59 between the N well region 39 and N− drift region 35 therefore separates the P well region 37 and the P+ first gate contact region 57.

Figure 12:
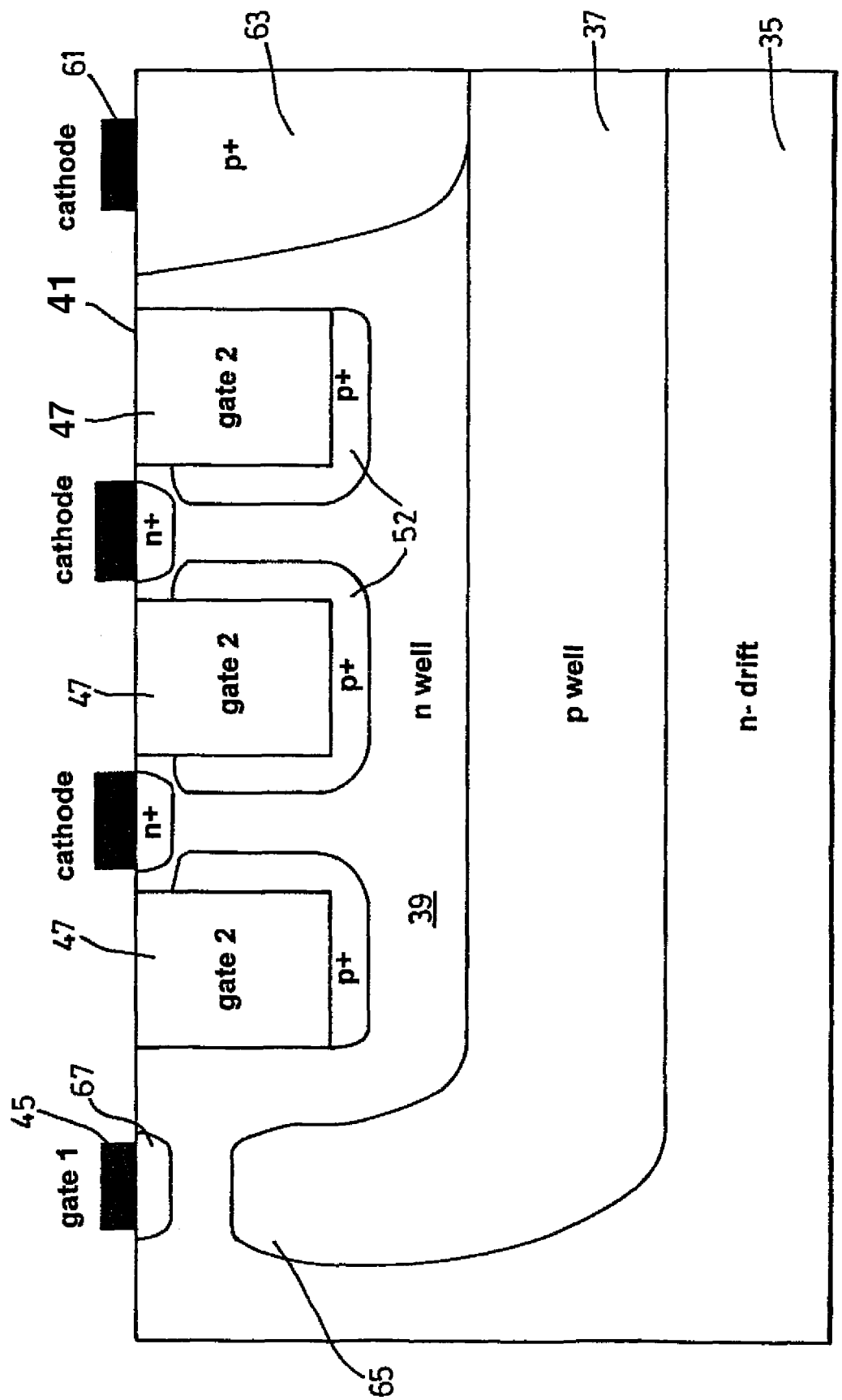
FIG. 12 shows a cross-sectional view of a ninth embodiment of a semiconductor device according to the present invention, with a lateral turn-on gate employing a resistive turn-on mechanism.

In the embodiment shown in FIG. 12, a second emitter electrode 61 contacts the P well layer 37 via a P+ emitter contact region 63 extending through the N well region 39. Thus, the P well region 37 does not extend to the upper surface 41 of the device. However, together with the P+ second emitter contact region 63, it surrounds the second gate electrode 47. At its uppermost extent 65, the P well region 37 is situated below a P+ contact region 67 which is in contact with the first gate electrode 45, the region therebetween being constituted by the transition between the N− drift region 35 and the N well region 39. Thus, resistive switching is employed in this embodiment.

Figure 13:
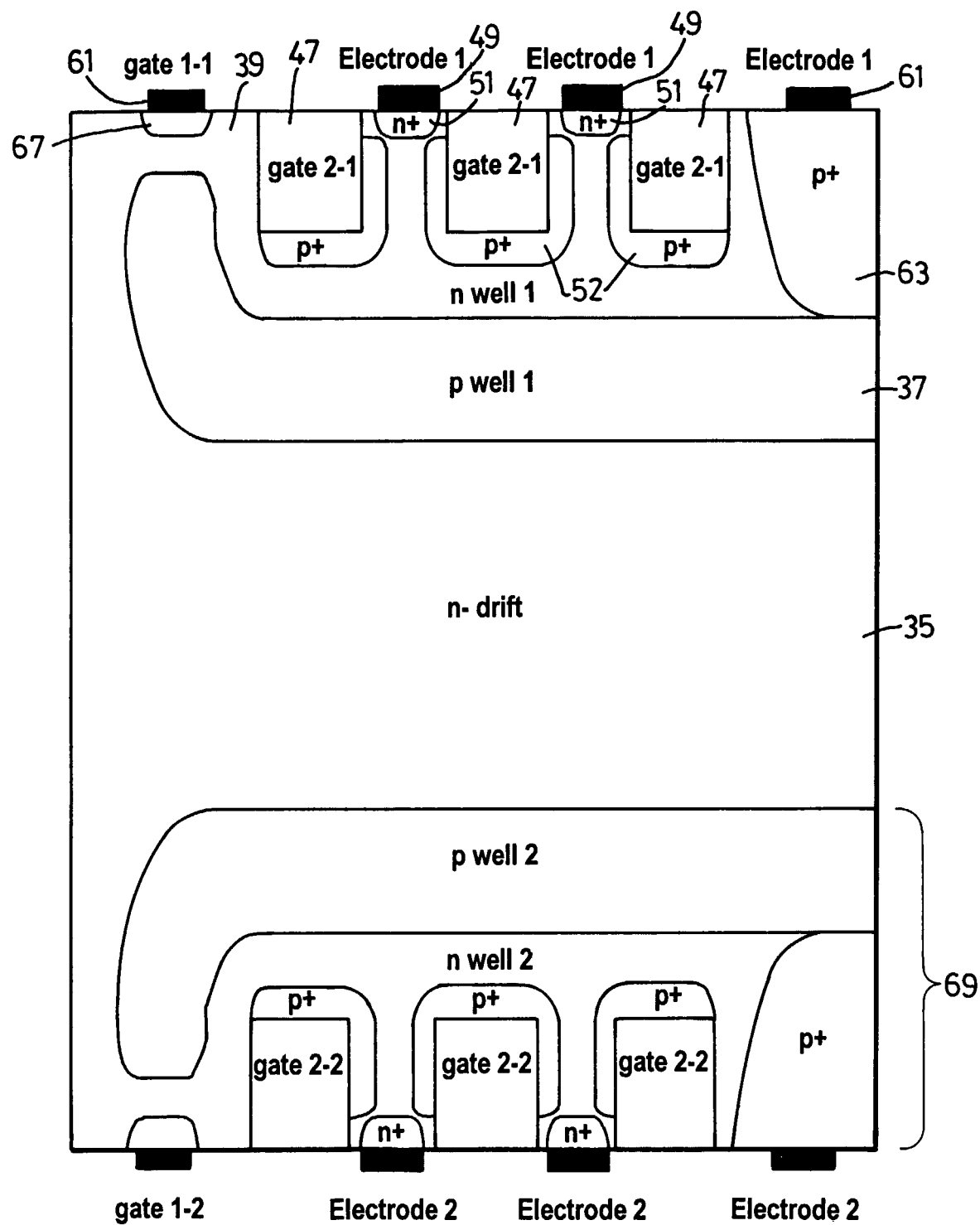
FIG. 13 shows a tenth embodiment of a semiconductor device according to the present invention formed as a bi-directional switch.

The concept embodied in FIG. 12 can be applied in back-to-back fashion as shown in FIG. 13, wherein a second structure, denoted by reference numerals 69 is formed on the opposite surface of the N− drift region 35 as the device shown in FIG. 13. Thus, the two devices can operate independently in the same loop circuit, in the manner of a bi-directional manual switch.

The invention claimed is:

1. A semiconductor device comprising:
    at least one cell including a base region of a first conductivity type having disposed therein at least one emitter region of a second conductivity type;
    a first well region of the second conductivity type;
    a second well region of the first conductivity type;
    a drift region of the second conductivity type;
    a collector region of the first conductivity type;
    a collector contact;
    wherein each cell is disposed within the first well region and the first well region is disposed within the second well region; and
    wherein the device further comprises a first gate in communication with the base region so that a MOSFET channel is defined between the at least one emitter region and the first well region, and an embedded region embedded in the first well region such that the embedded region is below the base region and separated from the base region;

wherein the device further comprises at least one transistor having the embedded region as a component thereof and is configured such that during operation of the device a depletion region at a junction between the base region and the first well region extends to a junction between the first well region and the second well region, thereby substantially isolating the potential of the first well region from any increase in the potential of the collector contact so that the device can be turned off without having to form a MOSFET channel between the base region and the second well region, the extension of the depletion junction being achieved through punch-through of the at least one transistor having the embedded region as a component thereof.

2. A semiconductor device according to claim 1 in which the embedded region is of the first conductivity type.

3. A semiconductor device according to claim 1 further including a second gate in communication with the second well region so that a MOSFET channel is defined between the first well region and the drift region.

4. A semiconductor device according to claim 1 further including:
a region of the first conductivity type in contact with an emitter contact; and
a region of the second conductivity type disposed between the region of the first conductivity type and the second well;
in which the region of the second conductivity type connects the first well region to the drift region in a JFET structure formed by the second well, said region of the second conductivity type and said region of the first conductivity type.

5. A semiconductor arrangement according to claim 1 in which the embedded region is in contact with an emitter contact.

6. A semiconductor device according to claim 5 in which the embedded region is in contact with the first gate.

7. A semiconductor device according to claim 6 in which the embedded region is disposed substantially underneath the first gate.

8. A semiconductor device according to claim 1 in which the embedded region is electrically floating.

9. A semiconductor device according to claim 5 or claim 8 in which the embedded region is encapsulated within the first well region.

10. A semiconductor device according to claim 8 in which the embedded region extends substantially from one side of the base region to the other.

11. A semiconductor device according to claim 5 or claim 8 including a substantially coplanar arrangement of a plurality of embedded regions disposed at a substantially common depth beneath the base region.

12. A semiconductor device according to claim 8 including a stacking of a plurality of embedded regions.

13. A semiconductor device according to claim 12 wherein the stacking of embedded regions extend substantially from one side of the base region to the other.

14. A semiconductor device according to claim 8 including a stacking of a plurality of substantially coplanar arrangements of a plurality of embedded regions disposed at a substantially common depth beneath the base region.

15. A semiconductor device according to claim 1 in which a doping concentration in the portion of the first well region which extends between the base region and the embedded region is different than a doping concentration in the portion of the first well region which extends between the embedded region and the second well region.

16. A semiconductor device according to claim 1 wherein the base region is one of a plurality of base regions disposed within the first well region, and the at least one emitter region includes a plurality of emitter regions, each base region having at least one of the plurality of emitter regions disposed therein.

17. A method of operating a semiconductor device, the device including:
at least one cell including a base region of a first conductivity type having disposed therein at least one emitter region of a second conductivity type;
a first well region of the second conductivity type;
a second well region of the first conductivity type;
a drift region of the second conductivity type;
a collector region of the first conductivity type;
a collector contact;
wherein each cell is disposed within the first well region and the first well region is disposed within the second well region; and
wherein the device further includes a first gate in communication with the base region so that a MOSFET channel is defined between the at least one emitter region and the first well region, and an embedded region embedded in the first well region such that the embedded region is below the base region and separated from the base region;
the method including a step of applying potentials to the device so that a depletion region at a junction between the base region and the first well region extends to a junction between the first well region and the second well region, thereby substantially isolating the potential of the first well region from any increase in a potential of the collector contact so that the device can be turned off without having to form a MOSFET channel between the base region and the second well region, the extension of the depletion junction being achieved through punch-through of at least one transistor having the embedded region separated from the base region as a component thereof.

18. A method according to claim 17 in which the at least one transistor includes a transistor formed by the embedded region, the first well region and the second well region, and in which the embedded region is in contact with an emitter contact, and in which the step of applying potentials to the device comprises causing a base of the transistor, comprised of the first well region, to punch-through.

19. A method according to claim 17 in which the at least one transistor includes at least one of a first transistor formed by the base region, the first well region and the embedded region, and a second transistor formed by the embedded region, the first well region and the second well region, and in which the embedded region is electrically floating, and in which the step of applying potentials to the device includes i) causing a base of the first transistor, comprised of the first well region, to punch-through and/or ii) causing a base of the second transistor, comprised of the first well region, to punch-through.

* * * * *